（12) United States Patent
Bogaerts

(10) Patent No.: US 11,843,011 B2
(45) Date of Patent: Dec. 12, 2023

(54) PIXEL AND GLOBAL SHUTTER IMAGE SENSOR

(71) Applicant: GPIXEL NV, Antwerp (BE)

(72) Inventor: Jan Bogaerts, Sint-Katelijne-Waver (BE)

(73) Assignee: GPIXEL NV, Antwerp (BE)

( * ) Notice: Subject to any disclaimer, the term of this patent is extended or adjusted under 35 U.S.C. 154(b) by 14 days.

(21) Appl. No.: 17/392,538

(22) Filed: Aug. 3, 2021

(65) Prior Publication Data

US 2022/0045114 A1 Feb. 10, 2022

(30) Foreign Application Priority Data

Aug. 6, 2020 (EP) .................................... 20189917

(51) Int. Cl.
*H01L 27/146* (2006.01)
*H04N 25/53* (2023.01)

(52) U.S. Cl.
CPC .... *H01L 27/14623* (2013.01); *H01L 27/1464* (2013.01); *H01L 27/14636* (2013.01); *H04N 25/53* (2023.01)

(58) Field of Classification Search
CPC .. H04N 5/353; H04N 5/3698; H04N 5/37452; H04N 5/379; H04N 5/374; H01L 27/14623; H01L 27/14636; H01L 27/1464; H01L 27/14609; H01L 27/14643
See application file for complete search history.

(56) References Cited

U.S. PATENT DOCUMENTS

| 9,666,621 | B2 * | 5/2017 | Yamazaki | ......... H01L 27/14623 |
| 2014/0015013 | A1 | 1/2014 | Arakawa | |
| 2015/0084098 | A1 * | 3/2015 | Choi | ................. H01L 27/14634 257/230 |
| 2016/0211306 | A1 | 7/2016 | Choi et al. | |
| 2018/0151619 | A1 * | 5/2018 | Yamashita | ........ H01L 27/14634 |
| 2018/0220086 | A1 * | 8/2018 | Hynecek | ................ H04N 25/75 |

(Continued)

FOREIGN PATENT DOCUMENTS

WO 2012042782 A1 4/2012

OTHER PUBLICATIONS

Search Report and Written Opinion from corresponding European Application No. 20189917.6, dated Nov. 17, 2020.

*Primary Examiner* — Lin Ye
*Assistant Examiner* — John H Morehead, III
(74) *Attorney, Agent, or Firm* — WORKMAN NYDEGGER

(57) ABSTRACT

A pixel for a global shutter pixel array includes a sensing layer and a storage layer. The sensing layer has a sensing element adapted to provide charges upon receiving radiation and a floating diffusion region for receiving charges from the sensing element. The storage layer has at least one storage node for receiving charges from the sensing layer's floating diffusion region and storing the charges. The sensing layer and storage layer form a stack of layers, the sensing layer covering at least the storage node of the storage layer, and the stack has a light shield between the sensing layer and the storage node of the storage layer, so the storage node is shielded from impinging radiation. The storage node is between two transfer gates. The storage node and its surrounding gates are provided between the first floating diffusion region and a second floating diffusion region.

10 Claims, 6 Drawing Sheets

(56) References Cited

U.S. PATENT DOCUMENTS

| | | |
|---|---|---|
| 2018/0288343 A1 | 10/2018 | McCarten et al. |
| 2019/0014278 A1* | 1/2019 | Kumagai ............... H04N 25/70 |
| 2020/0105810 A1* | 4/2020 | Moon ............... H01L 27/14625 |
| 2020/0106975 A1* | 4/2020 | Oike ...................... H04N 25/75 |
| 2020/0186731 A1* | 6/2020 | Chen .................... H04N 25/778 |
| 2020/0203416 A1* | 6/2020 | Jin .................... H01L 27/14607 |
| 2020/0228740 A1* | 7/2020 | Otaka .................... H04N 25/75 |
| 2020/0273896 A1* | 8/2020 | Innocent ........... H01L 27/14654 |
| 2020/0286942 A1* | 9/2020 | Jin .................... H01L 27/14627 |
| 2020/0286945 A1* | 9/2020 | Palaniappan ........ H04N 23/745 |

\* cited by examiner

PIXEL AND GLOBAL SHUTTER IMAGE SENSOR

FIELD OF THE INVENTION

The present invention relates to the field of radiation sensing. More specifically it relates to an active pixel and image sensor with global shutter functionality.

BACKGROUND OF THE INVENTION

Digital imaging uses sensing elements which generate charge carriers upon light impinging. The manipulation of the charges and generation of output signals based thereon can be made in different ways, depending on, for example, the type of electronics and sensing elements used. For example, global shutter (GS) mode is closer to traditional photography in the sense that all pixels simultaneously receive information to form an image. Global shutter is usually provided in charge-coupled devices (CCD) in an easy and simple implementation. However, CCDs have drawbacks and are commercially less viable. A different type of sensors are preferred for many applications, such as active pixel sensors, based on CMOS technology. Active pixel sensors have less expensive manufacture and can be addressed easily. A known disadvantage of active pixel sensors is the lower fill factor of the pixels, since the active circuitry takes surface area which is not sensitive to radiation. Additionally, the active pixel sensors are typically operated and addressed row by row with a speed of a fraction of a second. This is known as rolling shutter (RS) mode.

Rolling shutter mode suffers from several disadvantages such as distortion of images of moving bodies. Although GS CCDs do not experience these issues, due to the drawbacks of the CCDs, there is a tendency to adapt active pixel technology so active pixel sensors are granted with global shutter functionality.

However, adapting sensors based on active pixels to provide GS functionality is not trivial. Combining global shutter and active pixel technology requires tradeoffs (low resolution, speed, etc.) and adaptation of manufacturing routes. Nevertheless, several possibilities exist. These possibilities include providing GS pixels in charge domain, in voltage domain or in digital domain. GS pixels in charge domain have reduced fill factor and suffer from high sensitivity to parasitic light. GS pixels in voltage domain require in-pixel capacitors and suffer from noise. GS pixels in digital domain require an analog-to-digital converter (ADC) per pixel, which requires a large area of the pixel.

WO 2012/042782 discloses a solid-state imaging device with a first and a second semiconductor substrate. The first semiconductor substrate comprises a photoelectric conversion unit, a transfer transistor, and at least a part of electric charge holding unit. The second semiconductor substrate comprises a pixel additional circuit configured to process signal electric charges transferred to the electric charge holding unit or the signal amplified by an amplifying unit. A light shielding member configured to reduce light transmitted through the photoelectric conversion unit to enter the pixel additional circuit is disposed on the first substrate.

It would be desirable to provide image sensing with inexpensive and functional architecture, good performance and GS functionality.

SUMMARY OF THE INVENTION

It is an object of embodiments of the present invention to provide a pixel which shows high fill factor and low sensitivity to parasitic light, and a good functional image sensor having global shutter function.

The present invention provides a pixel for a global shutter pixel array, the pixel comprising a sensing layer and a storage layer. The sensing layer comprises a sensing element adapted to provide charges upon receiving radiation, and a first floating diffusion region for receiving charges from the sensing element. The storage layer comprises at least one storage node for receiving charges from the first floating diffusion region of the sensing layer and for storing said charges. The storage node is provided between two transfer gates, and the storage node and the two transfer gates are provided between the first floating diffusion region and a second floating diffusion region. Having the storage node located between two transfer gates allows the storage gate (the gate used as storage node) to be substantially or even completely depleted, which improves a complete transport of charges and which is advantageous for dark current and leakage current. The sensing layer and storage layer form a stack of layers, the sensing layer covering at least the storage node of the storage layer.

The stack further comprises a light shield at least between the sensing layer and at least the storage node of the storage layer, so the storage node is shielded from radiation.

It is an advantage of embodiments of the present invention that a storage node in charge domain can be provided for an image sensor with radiation shielding for the storage node. It is a further advantage that the pixel can be made very compact, as the readout stage and storage node can be stacked with the sensing layer, thus increasing the fill factor.

In some embodiments of the present invention, the sensing layer and the storage layer each comprise a connection to a different bias voltage, wherein the bias voltage of the storage layer is higher than the bias voltage of the sensing layer. It is an advantage of embodiments of the present invention that charge transfer is improved between the sensing and storage layer.

In some embodiments of the present invention, the storage layer comprises a region electrically connected to the floating diffusion region of the sensing layer so that the floating diffusion region extends into the storage layer forming a common floating diffusion region.

It is an advantage of embodiments of the present invention that a floating diffusion region in the storage layer allows an easy transfer of charge from the sensing layer to the storage node of the storage layer.

In some embodiments of the present invention, the common floating diffusion region is formed from at least one diode in each of the sensing layer and the storage layer.

It is an advantage of embodiments of the present invention that the electrical connection between the two layers can be provided easily, avoiding short circuits with the rest of the layer.

In some embodiments of the present invention, the first floating diffusion region is formed from a first diode in the sensing layer and a second diode in the storage layer, electrically connected to one another by a hybrid bonding pad.

It is an advantage of embodiments of the present invention that a compact layout with low profile and small area can be obtained.

In some embodiments of the present invention, the storage layer further comprises a readout stage adapted to provide a readout signal based on the charges stored in the storage node. It is an advantage of embodiments of the present invention that the readout circuit can be included in the same layer, further improving compactness of the pixel and adding shielding to the readout stage.

In particular embodiments, the readout stage comprises a source follower connected to a further floating diffusion region on the storage layer.

It is an advantage of embodiments of the present invention that the source follower is compact and the device can be implemented in a small area.

In some embodiments of the present invention, the pixel comprises a backside illumination configuration. It is s an advantage of embodiments of the present invention that the pixels can be made thinner.

In some embodiments of the present invention, the storage layer comprises more than one storage node, each adapted to receive charges from the floating diffusion region of the sensing layer and to provide charges to a same readout circuit.

In a further aspect the present invention provides an image sensor comprising an array of the pixels of any one of the previous claims, including circuitry configured to drive the array in global shutter mode.

It is an advantage of embodiments of the present invention that global shutter mode can be used in an image sensor based on active pixels, e.g. a CMOS image sensor, in a highly compact pixel distribution, e.g. with no need to increase the area of the sensor or reduce its sensing area.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
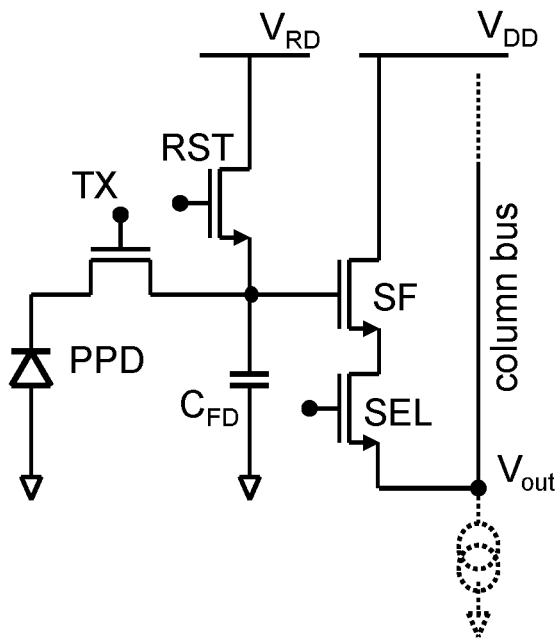
FIG. 1 schematically illustrates a prior art 4 T pixel based on CMOS technology, which operates under the rolling shutter mode.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is to be understood that embodiments of the invention may be practiced without these specific details. In other instances, well-known methods, structures and techniques have not been shown in detail in order not to obscure an understanding of this description.

Where in embodiments of the present invention reference is made to "radiation", reference is made to electromagnetic radiation of any type, e.g. visible light, UV light, (near) infra-red light, or even X-rays, gamma rays. Alternatively, the radiation may be particles, including low or high energy electrons, protons, hadrons or other particles Existing pixel technology is based on charge generation due to impinging radiation followed by charge transfer, which causes a variation of electric potential. This variation is used to provide a signal representative of the transferred charge and, in consequence, representative of the impinging radiation.

Image sensors include organized arrays of pixels, for example pixels logically organized in rows and columns. These pixels provide signals from which an image can be reconstructed. Throughout this description, the terms "row" and "column", having the co-notation of "horizontal" and "vertical", respectively, are used for ease of explanation only. They do not need to, but may, refer to an actual physical direction of the device. Furthermore, the terms "column" and "row" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely, as "logically organized in rows and columns". By this wording is meant that sets of array elements are linked together in a topologically linear intersecting manner; however, that the physical or topographical arrangement need not be so. For example, the rows may be circles and the columns radii of these circles and the circles and radii are described in this invention as "logically organized" rows and columns.

Rolling shutter and global shutter modes are the two main ways the pixels handle charge collection and manipulation for a sensor. In the rolling shutter method, an array of pixels collects light and provides a signal readout row by row (or column by column). The image is reconstructed row by row (or column by column) from the readout of pixels which received light simultaneously in the same row (or column). This creates distortion in images of moving objects. By contrast, in the global shutter method, the array of pixels collects light simultaneously in all pixels of the array. The charges are stored in each pixel temporarily, so they can be read with a single readout circuit, row by row (or column by column) like in the rolling shutter method. However, unlike in the rolling shutter method, the signals are obtained from the stored charge, which has been collected simultaneously. Hence, images of moving objects obtained by the global shutter method present no distortion.

The working principle of a standard, existing 4 T pixel in rolling shutter mode is explained with reference to the schematic pixel representation of FIG. 1. Such pixel can include a (pinned) photodiode PPD for charge collection and a floating diffusion connected to the PPD via a transfer element TX, e.g. a transfer transistor. A reset transistor RST is provided to connect or disconnect the floating diffusion to a pixel voltage $V_{RD}$. A source follower SF and a select transistor are provided to obtain the measurement of the voltage, based on the charge in the floating diffusion. A column bus is provided to obtain the output signal $V_{out}$ of the pixel.

Photon-generated charges are collected and stored during the exposure time in the (pinned) photodiode PPD. Just before the readout of the pixel is done, charges affecting the floating diffusion capacitance $C_{FD}$ are removed, so the floating diffusion region is being reset, by connecting, by means of the reset transistor RST, the floating diffusion capacitance $C_{FD}$ to the pixel voltage $V_{RD}$. After this reset action, the voltage on the floating diffusion is sensed. Hereto, the source follower SF is activated by connecting the SF to its load on the column bus. This connection is realized by activating the row select transistor SEL. The signal sensed by means of the source follower SF is "copied" on the column bus. This is a first measurement: a reference signal of the pixel. For the second measurement, which is the actual measurement of the collected charges, the charge from the PPD is transferred to the floating diffusion capacitance $C_{FD}$ by activating the transfer element TX. Due to the charge transfer, the voltage on the capacitor $C_{FD}$ will be lowered. This lower voltage will be sensed by the source follower SF and will be "copied" to the column bus, when the source follower SF is selected, via the row select transistor SEL, to do so. This provides a second measurement: the output signal $V_{out}$ of the pixel.

The readout of the pixel is now complete. The row select switch SEL will be de-activated as before. Correlated double sampling (CDS) can be realized by subtracting the reference signal from the output signal of the pixel. In this way a final signal can be generated with a very low noise level.

Figure 2:
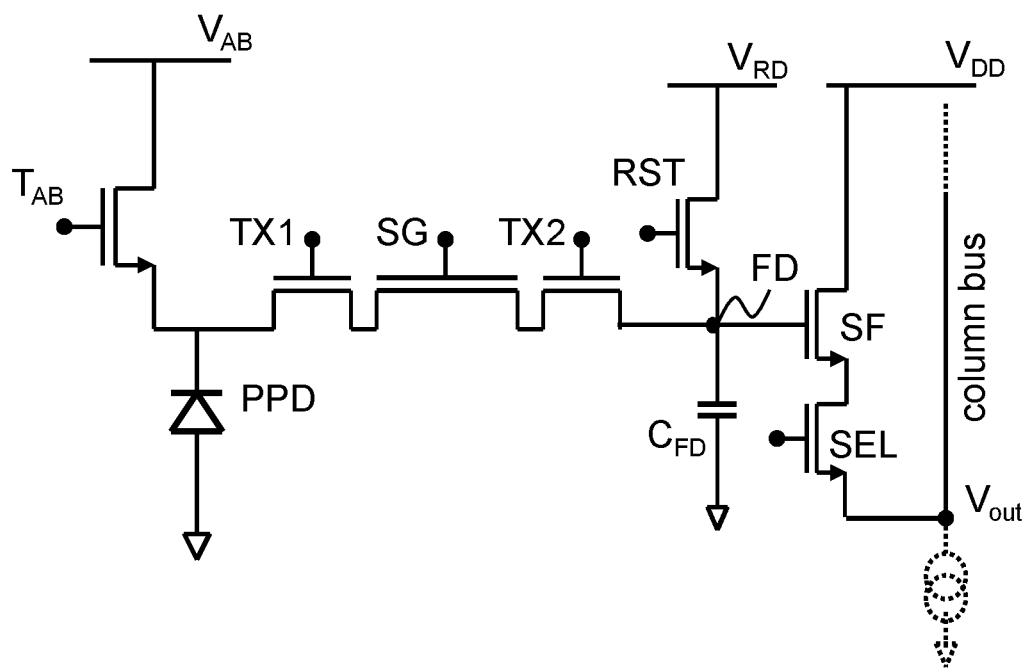
FIG. 2 schematically illustrates a prior art pixel based on CMOS technology which has been adapted and extended so it can operate under global shutter mode, including a charge storage node.

As explained earlier, rolling shutter mode suffers from several disadvantages, and it is preferred to provide an active pixel, such as a CMOS-based pixel, that can be used in GS mode. More specifically, a pixel similar to the one shown in FIG. 1 can be used in the global shutter mode by including an extra charge storage memory node. The pixel may include additional transistors, as illustrated in FIG. 2, with a pixel similar to that of FIG. 1. In the pixel of FIG. 2, a storage gate acting as storage node SG is provided between the photodiode PPD and the floating diffusion FD. A first transfer element TX1 is provided to control the transfer of charges from the photodiode PPD to the storage gate node SG and a second transfer element TX2 is provided to control the transfer of charges from the storage gate node SG to the floating diffusion FD which will affect its capacitance $C_{FD}$. A predetermined number of such pixels may be logically organized in rows and columns of an array.

The pinned photodiode PPD of each pixel can be exposed to radiation (e.g. near-IR, visible radiation, . . . ). The photo-generated charges are collected and stored during the exposure time in the (pinned) photodiode PPD. An antiblooming transistor $T_{AB}$ can be used to prevent overexposure and charge overflow issues and/or to define the exposure time, totally independent of the readout sequence.

At the end of the exposure time, the transfer element TX1 is activated for all pixels in the array at the same time, and all pixels move their photon-generated charge to their individual storage nodes SG.

After the charge transfer, the PPD is emptied for all pixels, and in principle a new exposure can start, for all pixels at the same time, as in usual GS image sensors.

The readout of the pixels can start line after line, in the same way as the classical 4 T pixel in rolling shutter mode. Before shifting any charge to the capacitance $C_{FD}$ of the floating diffusion, this capacitance $C_{FD}$ can be reset. This is done by means of the reset transistor RST, as explained with respect to FIG. 1.

Accordingly, the source follower SF is activated by connecting the source follower SF to its load on the column bus via the row select transistor SEL as explained with reference to FIG. 1, reading the reset voltage of the floating diffusion connected to the gate of the source follower SF and providing the first measurement (reference voltage of the pixel). Then as before, the charge from the SG is transferred to the floating diffusion with capacitance $C_{FD}$ through the active transfer element TX2, lowering the voltage on the CFD as explained earlier, thus providing the second measurement (the output signal $V_{out}$ of the pixel).

In principle the pixel is completely read out, and the row select switch SEL will be de-activated. As before, CDS can be provided.

This pixel architecture, although it successfully provides GS functionality to a CMOS image sensor, is known to suffer from issues, among which are its limited parasitic light sensitivity performance, especially for non-perpendicularly incoming light and for light with a longer wavelength like red or (near-)IR. For example, the storage node SG next to the PPD may receive noisy signals from impinging radiation, as it is placed next to the PPD. Thus, an extra shielding layer is required. Another drawback is the reduction of the size of sensing area in the pixel. The fill factor is reduced due to the area of the pixel taken by the storage node SG and related active circuitry.

The present invention provides an active pixel which can be used in a global shutter sensor insensitive to parasitic light and with a large fill factor. It includes two stacked layers, a first layer including the sensing element and a transfer element to remove charges thereof, being called a sensor layer, and a second layer, being called a storage layer, which includes at least a memory element. The memory element is adapted to accept charges from the floating diffusion region which is shared and common to both layers, and which receives charges from the sensing element. The memory element gives the possibility of GS to a pixel array including these active pixels.

In a first aspect, the present invention relates to a pixel comprising two or more stacked layers. One of the layers is configured in the pixel to be exposed to radiation such as, but not limited thereto, visible light. For example, if the pixel is used to be exposed to high-energy or to particle radiation, including low or high energy electrons, protons, hadrons or other particles, or e.g. X-rays and gamma rays, a scintillator can be used to convert the radiation to visible photons, which are then captured by the layer to be exposed to radiation.

This layer includes a sensing element where photocharges generated by impinging radiation are collected. This layer is the "sensing layer". It also comprises a floating diffusion region to which the collected charges can be transferred. The floating diffusion region extends into the second layer, which includes a memory element which can collect and store the charges from the floating diffusion region.

The sensing layer may include a transfer element, such as a gate, to transfer the charges from the sensing element to the floating diffusion node FD1. It may include a reset transistor to reset the floating diffusion region. The sensing layer may also include a transistor to avoid signal bleeding (antiblooming transistor) as explained earlier. Aside of these circuit elements, the sensing element may occupy most of the area of the sensing layer. Notably, the memory element (s) of the pixel may be included in the storage layer. Thus, memory elements and readout circuitry (including source followers) are not present in the sensing layer. The storage layer may include, besides the memory element, also readout circuitry for providing an output signal based on the charges stored in the memory element.

Figure 3:
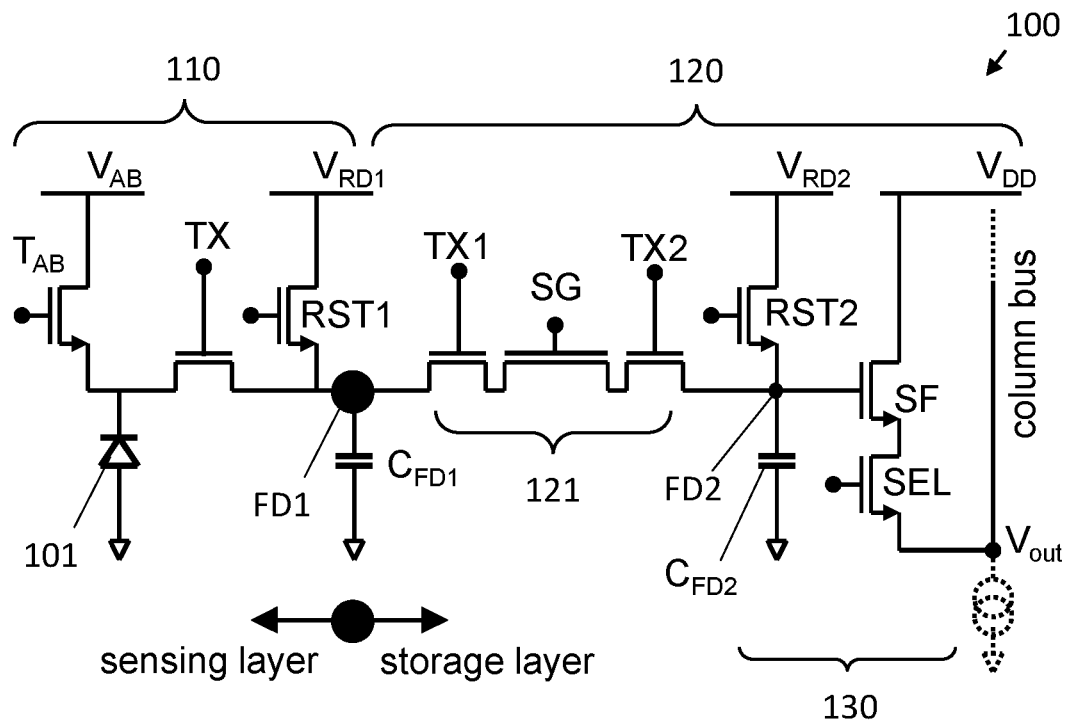
FIG. 3 schematically illustrates a first embodiment of a pixel of the present invention, including a first layer with a sensing element and a second, stacked layer, including memory elements. Both layers share a floating diffusion region extending between the two layers.
Figure 12:
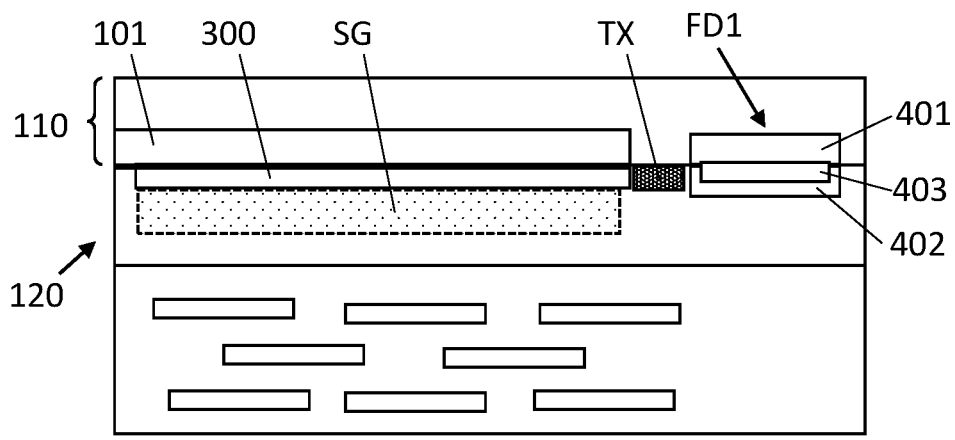
FIG. 12 and FIG. 13 illustrate a cross section and top view, respectively, of a pixel in accordance with an embodiment of the present invention.
Figure 13:
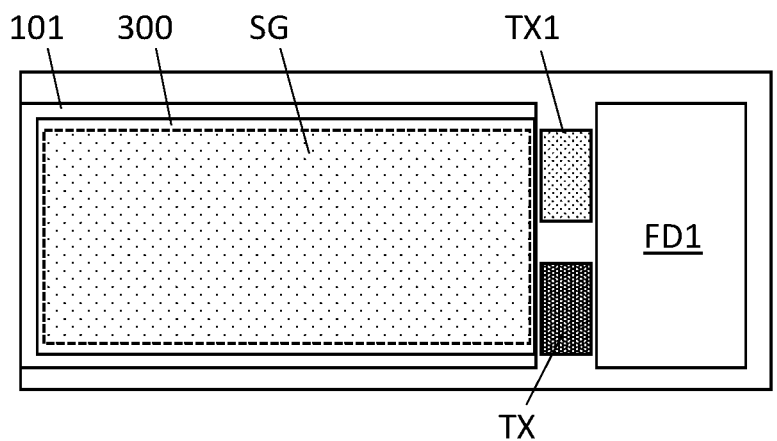
Figure 14:
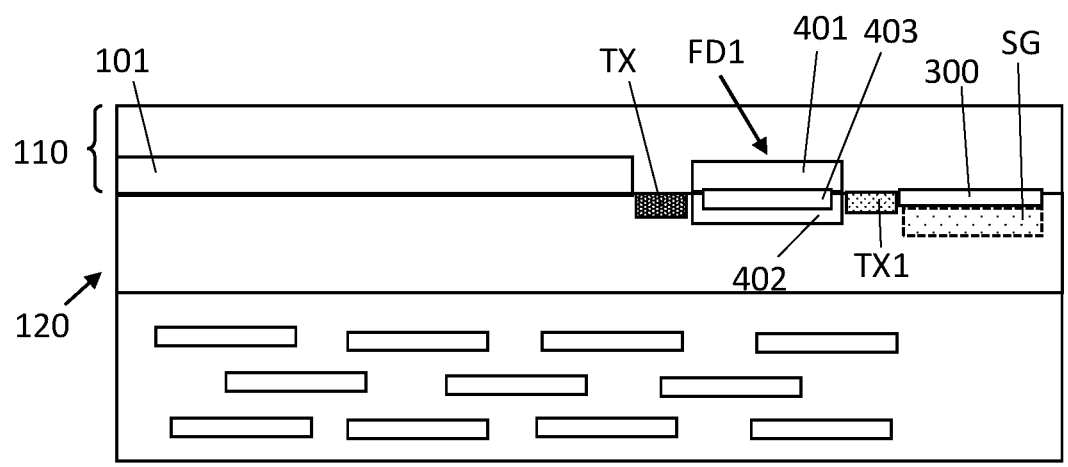
FIG. 14 illustrates a cross section of a pixel in accordance with an alternative embodiment of the present invention.

FIG. 3 shows a pixel 100 according to embodiments of the first aspect of the present invention, where constituting parts of the pixels are divided into two layers, a sensing layer 110 and a storage layer 120. These two layers, although shown next to one another in the schematic illustration of FIG. 3, are stacked onto one another in reality. A cross-sectional view of such stacked layers is shown in FIG. 12 and FIG. 14. The stacked layers 110, 120 may be individual semiconductor substrates, e.g. silicon substrates. The storage layer 120 and sensing layer 110 may both include diodes 402, 401, the diodes being electrically connected e.g. by a metallization layer 403, thus forming a common floating diffusion region. The use of diodes helps providing connection between both layers without short circuit to the substrates.

The sensing layer 110 may be thinner than the storage layer 120. For example, depending on the application the sensing layer 110 may be in the order of microns, for example for visible light the sensing layer 110 may be about 3 µm. The storage layer may have a thickness typical of a wafer, for example 700 µm, for example 1 mm, etc.

The sensing layer 110 may be a top layer, and the storage layer may be provided underneath it, where "top" and "underneath" are expressed in function of the direction of irradiation: the top layer is closer to a source of irradiation, or the point the irradiation comes from, than the layer underneath it. In general, the sensing layer is a layer arranged in the pixel to receive radiation from a radiation source, for example a layer which can be exposed to visible light or (near-)IR radiation. The storage layer 120 may underlie the sensing layer 110. Thus, this invention can be applied to backside-illuminated (BSI) sensors. The storage layer 120 may be shielded from irradiation directly impinging on it.

The sensing layer 110 comprises a radiation sensitive element, also called sensing element 101. The sensing element 101 is disposed on the pixel 100 so that it receives radiation, e.g. visible radiation, near-IR radiation, etc. from an outside source (a radiation source, an optical system such as a lens system, etc.). For example, it may be a photodiode, for example a pinned photodiode (PPD).

A portion of the sensing layer 110 includes a region adapted to receive charges from the sensing element 101, usually called a floating diffusion (FD) region with a predetermined capacitance $C_{FD}$. For example, it may be a doped area on the substrate, for example it may be a diode. The present invention provides a floating diffusion region FD1 which is common to both the sensing layer 110 and the storage layer 120, as explained below.

A transfer element TX can be used to allow or block charge transferal from the sensing element 101 to the FD region FD1. The sensing element 101 can collect and store charges generated during exposure, until the transfer element TX of the sensing layer 110 is activated. Activation of the transfer element TX causes the collected charges of the sensing element 101 to be transferred to the floating diffusion region. The transfer element TX of the sensing layer 110 may be a transfer gate, such as a transfer gate of a transistor, e.g. of a MOSFET.

In some embodiments, a reset transistor RST1 connectable to the pixel voltage $V_{RD1}$ is added in the sensing layer 110 to reset the FD region. As the floating diffusion "extends" through both layers, alternatively, the reset transistor RST1 may be provided in the storage layer 120, so it does not take area in the sensing layer 110 thus increasing the fill factor for the sensing element 101. During use, the capacitance $C_{FD1}$ of the floating diffusion region is reset before shifting charges thereto.

In some embodiments, the sensing layer 110 may also include an anti-blooming element $T_{AB}$ (e.g. an anti-blooming transistor) with same functionalities as explained earlier.

The storage layer 120 includes a memory element 121 which can receive charges from the FD region of the sensing layer 110, for example from the common floating diffusion region FD1 shared by the sensing layer 110 and the storage layer 120. The memory element 121 may store charges and, upon request, send them to a readout stage. In more detail:

The storage layer 120 includes a floating diffusion region equipotential with the FD region of the sensing layer 110. The sensing and storage layers 110, 120 may be adapted so that the FD of the sensing layer 110 extends into the storage layer 120. The device used to provide the regions may be diodes. For example, the sensing layer 110 may include a first diode 401 as FD region, and the storage layer 120 may include a second diode 402 electrically connected to the first diode, thus forming a floating diffusion region FD1 common to both layers. For example, a contact 403 may be used to interconnect both diodes, such as a resistive contact, e.g. a hybrid bonding pad. The interconnection between the sensing layer 110 and the storage layer 120 is represented in FIG. 3 as a black circle at the level of floating diffusion FD1. The diodes are shown in detail in FIG. 12 and FIG. 14.

The common floating diffusion node FD1 has a capacitance $C_{FD1}$ to accept charges transferred from the sensing element 101. Transferring charges from the sensing element 101 causes a shift in the voltage of the capacitor $C_{FD1}$, which can be used as input signal for the memory of the pixel.

The memory element 121 may operate in a similar way as the charge input structure of a traditional CCD. For example, the memory element 121 may include three adjacent gates which can be controlled independently, for example two transfer elements TX1, TX2 for transferring or blocking charges adjacent to a storage node SG for storing transferred charges. In some embodiments, the storage node SG covers an area corresponding with the area occupied by the sensing element 101 of the sensing layer 110. The size of the diode in the sensing layer and the size of the storage node in the storage layer are independent from one another. While the area of the pixel's sensing layer and the area of the pixel's storage layer should preferably correspond to one another, the components may be different; for example the first diode 401 may have different shape and/or size than the second diode 402.

The transfer elements TX1, TX2 and storage node SG may comprise transfer gates which can be independently controlled. The transfer element TX2 may be used to transfer charges out of the storage node SG. In embodiments of the present invention TX2 will be referred to as output element TX2. In some embodiments, the output element TX2 allows charge transferal to a second floating diffusion FD2 region of the storage layer, which presents a known capacity $C_{FD2}$.

It is an advantage of embodiments of the present invention that the storage node SG is located in between two transfer elements TX1, TX2. The whole memory element 121, i.e. in embodiments of the present invention the two transfer elements TX1, TX2 and the storage node SG therebetween, may preferably be provided between the first floating diffusion node FD1 which forms part of the sensing layer, and the second floating diffusion node FD2. The storage node SG can be completely depleted. This improves a complete transport of collected charges, which advantageously reduces dark current and leakage current.

In embodiments of the present invention, the storage layer 120 comprises a storage reset transistor RST2 to reset the storage node in order to wipe the pixel memory. For example, both the output element TX2 and the reset transistor RST2 can be activated so the charges in the storage node are flushed away (e.g. to a reset drain source $V_{RD2}$). Also the floating diffusion FD2 is then set to a reset voltage $V_{RD2}$.

Because the pixel 100 includes the sensing layer 110 and the storage layer 120 forming a stack of layers, the sensing layer 110 can receive radiation and at the same time block the radiation from reaching the storage layer 120. Therefore, sensitive circuitry on the storage layer 120 can be shielded from parasitic radiation, e.g. radiation falling on the pixel following a slanted or oblique ray. For example, at least part of the memory element 121 (e.g. at least the storage node SG) can be physically overlapped by the sensing layer 110.

Additionally, light shielding can be provided in the stack, between the sensing layer 110 and the storage layer 120. For example, a light screen or shield 300 may be provided to the sensing layer 110 and/or to the storage layer 120, e.g. it may be provided at the level of metallization of the sensing layer 110 or of the storage layer 120. The light shield 300 may be a layer of opaque material compatible with the layers of the stack. For example, a light screen or shield 300 being a metal layer may be provided in the stack as the light shield between the sensing and storage layer. The light screen or shield 300 may be arranged so as to prevent irradiation from impinging on at least part of the storage layer 120, for example at least on the storage node SG. In embodiments of the present invention the light screen or shield 300 may be on the top layer 110 or in the bottom layer, it may be configured to block the storage node SG from impinging radiation, for example it may be provided close to the storage node SG. This light shield ensures that the storage layer 120, in particular the storage node SG, is nicely shielded from incident light. In embodiments of the present invention, the light shield may be laid out to additionally prevent light from impinging on the transfer elements (such as transfer gates) of the storage layer; for example the light shield may cover at least the storage node and also the transfer elements, advantageously lowering the sensitivity of the storage node to parasitic light.

The sensing layer 110 may be connected to a first bias voltage and the storage layer may be connected to a second bias voltage. The first and the second bias voltages can be different form each other. In order to generate and/or improve charge transfer between the sensing layer and the storage layer, the first bias voltage should be lower than the second bias voltage.

The pixel 100 may include a readout stage 130 to extract readout signals from the charges generated by radiation. In particular, the readout stage 130 can provide an output signal based on the charges stored in the memory element 121. The signals may be transferred via a column bus to a readout circuit and to an image display, a memory or the like.

For example, the memory element 121 can send the stored charges to a second floating diffusion node FD2 (for example by suitably controlling transfer elements TX1, TX2 and storage node SG included in the memory element). The voltage of the second floating diffusion node FD2 changes, and the change can be sensed by the readout stage, for example by a source follower thereof. The voltage on the column bus changes accordingly, thus providing an output voltage of the pixel 100. This way, the voltage of the floating diffusion FD2 can be read before the transfer of charges from the storage gate SG to the floating diffusion FD2 (reset voltage) and after said transfer, allowing correlated double sampling (CDS) by subtraction of the output voltages before and after transfer of charges. This way, the pixel can provide a final signal with a very low noise level.

In some embodiments of the present invention, the storage layer 120 comprises the readout stage 130. For example, the storage layer 120 may comprise a second floating diffusion node FD2 characterized by a capacitance $C_{FD2}$. The charges can be read therefrom by a monolithically integrated readout stage 130, for example by a source follower SF integrated in the storage layer 120. It is an advantage that the pixel 100 can be made very compact. Further, by providing the different layers in accordance with embodiments of the present invention, e.g. by the configuration of the light shield 300, the readout stage 130 can be also shielded by the sensing layer 110, thus reducing sensitivity to parasitic radiation and the like, and reducing noise of the pixel. For example, the light shield may cover the storage node and at least the floating diffusion of the readout stage, optionally also other elements of the readout stage 130.

In some embodiments of the present invention, the pixel is not limited to a single storage node.

Figure 4:
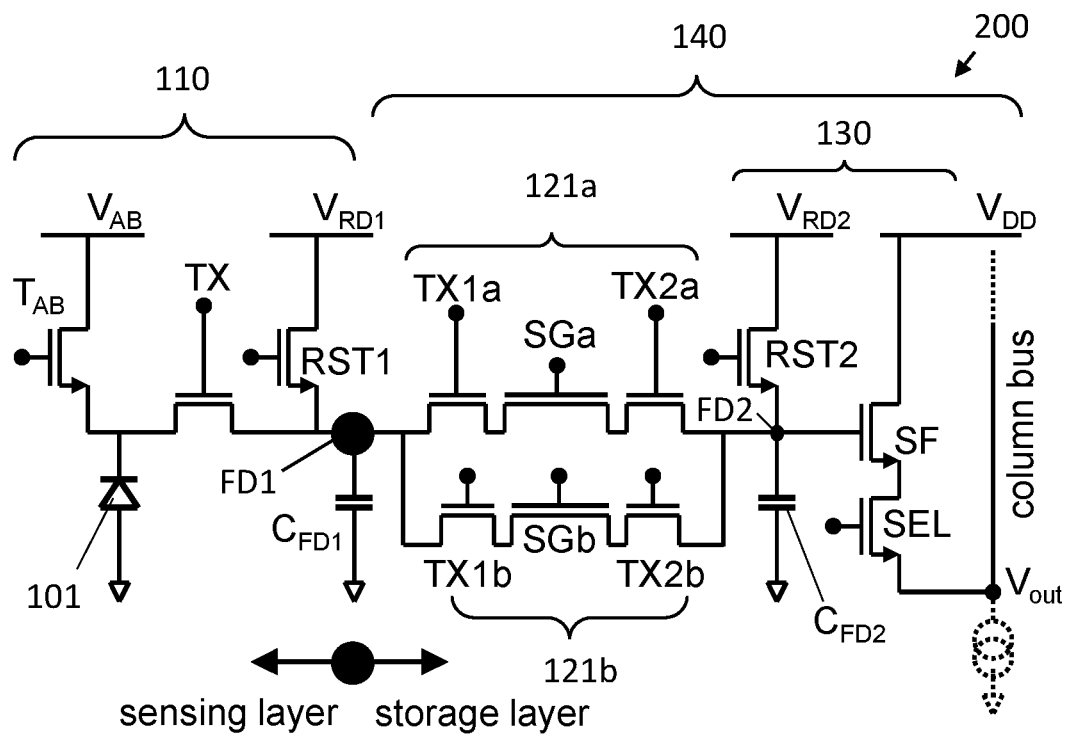
FIG. 4 illustrates a further embodiment of a pixel of the present invention, including several storage nodes in the second layer for allowing high dynamic range imaging.

FIG. 4 shows an alternative embodiment of a pixel 200 comprising a plurality of memory elements 121a, 121b (two as shown in the figure, the present invention not being limited to only one or two), identified with the addition of "a" and "b" in the reference signs. For example, a plurality of storage nodes SGa, SGb can be added to the storage layer 140. For example, further transfer elements TX1a, TX1b, such as transfer gates, can be used to allow independent transfer of charges from the floating diffusion node FD1 to each one of the storage nodes. As before, the common floating diffusion node FD1 is shared by both the sensing layer 110 and the storage layer 140. The memory elements 121a, 121b may be connected to a readout stage, e.g. a single readout stage 130 per pixel; hence a single readout stage for reading out charges on each of the storage nodes SGa, SGb. For example, a further output element TX2a, TX2b may be provided for each storage node SGa, SGb, for transferring the charges to the further floating diffusion FD2 (with a predetermined capacity $C_{FD2}$) for readout, using one readout stage 130 (which may be an SF as before).

Such pixel 200 can be used in high dynamic range (HDR) imaging. For instance, in a dual exposure HDR mode, a long exposure result can be stored in a first storage node SGa, and the short exposure result can be stored in a second storage node SGb.

The light shield may cover at least the storage gate or gates, optionally the transfer elements, optionally also at least the further floating diffusion FD2.

In some embodiments of the present invention, for example in embodiments with one or more storage nodes, the light shield covers the whole storage layer (except on the electrical contacts between the two layers), preventing light from impinging on the electronic elements of the storage layer (transfer elements, storage node, readout stage, etc).

The circuitry, contacts, gates and stages (such as readout stage) can be provided in or on a substrate. The sensing layer and/or the storage layer may comprise such substrates with integrated elements.

In a further aspect, the present invention relates to an image sensor with global shutter (GS) capabilities. The image sensor comprises an array of pixels in accordance with embodiments of the present invention, logically organized in rows and columns, and includes control circuitry which provides control over the exposition of the pixels. The control circuitry may be a central control unit which controls the activation of the transfer elements of each pixel of the plurality of pixels (e.g. all pixels) of the array, including the anti-blooming transistors (thus allowing control of global exposure) as well as the memory elements and resets.

Figure 5:
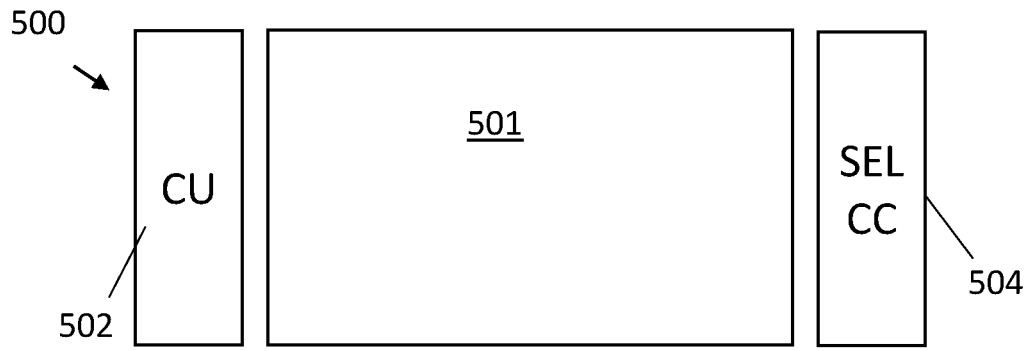
FIG. 5 illustrates an image sensor including an array of pixels in accordance with embodiments of the present invention, and further driving circuitry to address different circuit elements of each pixel.

FIG. 5 schematically shows an image sensor 500 comprising an array 501 of pixels 100, 200 as those described with respect to FIG. 3 or FIG. 4, the image sensor 500 including a control unit 502. For example, the present invention is not limited by the number of pixels in the array 501, which may comprise for example millions of pixels, as the technology allows. The pixels of such image sensor 500 can behave as the pixel shown in and explained with respect to FIG. 3 or FIG. 4, thus providing GS sensor functionality to the sensor 500. The control unit 502 can control, for example, the transfer of the charges out of the sensing element 101, the collection of charges in the storage node SG, SGa, SGb, the removal of charges from the storage node to each readout stage 130, and for example the anti-blooming transistor $T_{AB}$ and reset transistors RST1, RST2. The actual readout may be controlled also by the control unit 502, or alternatively by a "select" control circuit 504 which can interchange information and/or can be synchronized with the control unit 502, for controlling the select transistor SEL of each pixel 100, 200. A readout circuit may accept the signals from each column bus and for example provide CDS, signals for memory storage or display, etc., as it is known in the art.

In some embodiments, the charge transfer from the sensing element 101 to the readout stage 130 of each pixel in an array can be performed by controlling the transfer elements as is explained in the following.

Exposure of the sensing layer 110 and collection of charges in the sensing element 101, as well as the use of the anti-blooming transistor $T_{AB}$, can be the same as with the corresponding PPD and anti-blooming transistor $T_{AB}$ of FIG. 2.

Reset of the floating diffusion region FD1 can be done as explained earlier, for example by activating the reset transistor RST1 connected to the floating diffusion region FD1, which provides a high speed reset with low power consumption. The present invention, however, is not limited to this; for example it may be possible to remove parasitic charges through TX-TX1-TX2.

The memory element can be "cleaned" or "erased" by removing the charges, also by activation of the relevant elements (e.g. output element TX2) and the reset transistor RST2 of the storage layer.

As in GS pixels, the photon generated charges are transferred from the sensing element 110 to their floating diffusion regions FD1 simultaneously, as explained with reference to FIG. 2. This can be done in all the pixels of the array by providing the suitable activation signals using the control unit 502 of the image sensor. The control unit 502 may also control the anti-blooming transistor $T_{AB}$ and the reset transistor RST.

As mentioned earlier, the floating diffusion region FD1 adjacent to the sensing element 101 is common to both layers ("common floating diffusion region"), and may comprise a diode on the sensing layer of the stacked device, a diode on the storage layer of the stacked device, and an electric contact, e.g. a resistive contact such as an interconnect metallization between the two layers of the stacked device (e.g. hybrid bonding pads).

The transfer of the charge towards the common floating diffusion region FD1 will introduce a shift in voltage of its capacitor $C_{FD1}$. This voltage on $C_{FD1}$ is used as an input (e.g. input signal, e.g. comprising charges) for the memory element, in particular the transfer element TX1-storage node SG combination, in a similar way as how the charge input structure of a CCD is used: TX1 is opened, charge flows into the storage node SG, and subsequently TX1 is closed again. Hence, the charges are moved from the sensing element 101 to the common floating diffusion region FD1 and finally into the storage node SG. This can be done for all pixels at the same time, for example also by means of the control unit 502 shown in FIG. 5, e.g. a central control unit integrated on chip. A controller located at the level of the storage layer can be provided. This advantageously allows using different routes to provide the layers, e.g. CMOS fabrication processing to provide the storage layer and the cheaper nMOS fabrication processing route to provide the sensing layer.

After the charge transfer, the sensing element 101 is emptied (reset) for all pixels and a new exposure can start, for all pixels simultaneously, thus giving the image sensor GS functionality.

The readout of the pixels can start line after line (e.g. by rows or columns), in the same way as the classical 4 T pixel in rolling shutter mode. This can be controlled by a select control unit 504, which may or may not be a part of a central control unit 502. Although the readout has analogous steps as the readout in an RS sensor, the collected charges have been generated simultaneously for pixels of all rows and columns, e.g. for all pixels of the array, as in a GS sensor. Thus, no skew or distortion appears when taking images of moving bodies. More in detail:

The readout stage may comprise a source follower and a second floating diffusion region FD2 connected to the gate of the source follower. The interaction between the source follower and the floating diffusion region FD2 is similar as earlier with reference to FIG. 2. Just before performing the readout of one row of pixels, the capacitor $C_{FD2}$ of the second floating diffusion is being reset by means of the reset transistor RST2. Next the source follower SF is activated by connecting it to its load on a column bus. This connection can be realized by a row select transistor SEL. After the reset action, the voltage on the floating diffusion is sensed by means of the source follower SF, and the voltage is "copied" on the column bus. This provides a first measurement of a reference voltage of the pixel.

Then, readout can be performed, again as explained with reference to FIG. 2. Charges from the storage node SG are transferred to the floating diffusion region FD2 through TX2, or TXa, TXb, thus lowering the voltage on the capacitor $C_{FD2}$ of the second diffusion region FD2. This lower voltage is sensed by the source follower SF and "copied" to the column bus. This provides a second measurement of the output voltage of the pixel.

In principle the pixel is completely read out, and the row select switch SEL can be de-activated. As before, CDS can be provided, so the final signal can be realized with a very low noise level.

In summary, the simultaneous exposure time for all the pixels (starting at the same time, for example) provides the "global shutter" effect in an active pixel with a well shielded storage node, as it is located on the storage layer hidden from incoming radiation and protected by a light shield covering at least the storage node as explained with reference to embodiments of the first aspect of the present invention.

In the following, a method to drive a pixel in accordance with embodiments of the first aspect of the present invention will be shown. The method is similar to the method used to drive the pixel of FIG. 2, taking into account that an extra reset transistor can be added to reset the common floating diffusion node FD1, which can be used before transfer of charges from the sensing element.

Steps of the method comprise activating the transfer elements, transistors and storage nodes, as schematically shown in the electric potential diagrams of FIG. 6 to FIG. 12. The positive direction of the potential is downwards on the drawings.

Figure 6:
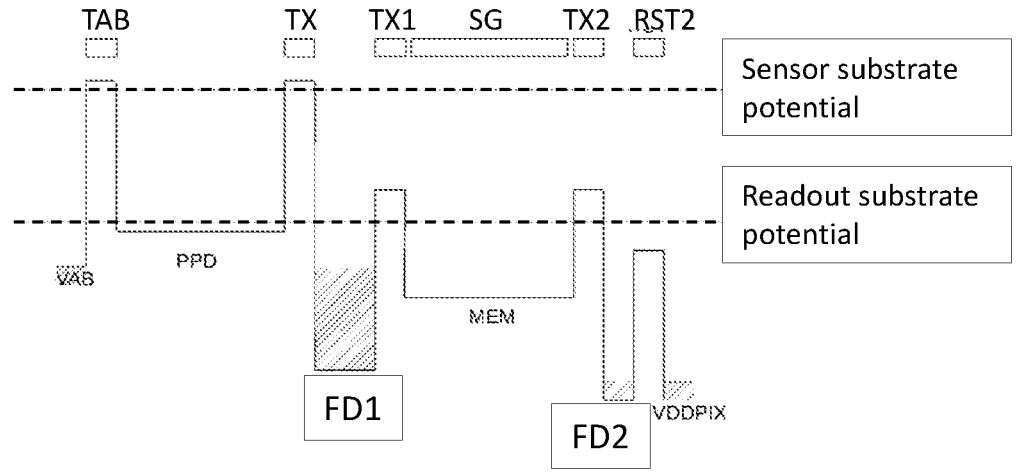
FIG. 6 to FIG. 11 illustrate the configuration of potentials and charges during a cycle of exposure and charge transfer to the memory element.

The schematic potential diagram of FIG. 6 shows the starting point before exposure. From left to right, the potential VAB of the anti-blooming drain is usually biased at a relatively high potential, e.g. 3.3 V. The gate of the anti-blooming transistor is shown, biased at a lower voltage, a typical value being slightly above 0 V. The sensing element (e.g. PPD) is indicated with its (pinning) voltage, typically somewhere in the middle of 0 V and 3.3 V, e.g. 1.5 V. At the right side of the PPD, the transfer element TX is present. Although in FIG. 6 the transfer element TX is biased at the same potential as the anti-blooming transistor TAB, this is just a non-limiting example. The potential well of the PPD (also known as the bucket of the PPD) is nicely defined between the voltages on the anti-blooming gate and the transfer element TX (e.g. the transfer gate) of the sensing layer 110.

The dashed area FD1 in FIG. 6-FIG 12, next to the transfer element TX of the sensing layer, represents the voltage on the floating diffusion region. This voltage is the same at the sensing layer as it is on the storage layer, because the two parts of the common floating diffusion region FD1 (e.g. the diodes acting as floating diffusion regions) are electrically connected.

Next to the floating diffusion region, on the storage layer 120, 140, the memory element 121 includes three controllable elements, e.g. three gates. The middle gate may be adapted to accept and store charges; it is considered the storage node SG. It is surrounded by two transfer elements TX1, TX2 for transfer of charges into the storage node, respectively for removing or outputting charges from the storage node.

The transfer element TX1 is biased at a low voltage, the gate SG (used as the storage node) is biased at a high voltage, and the output element TX2 is biased at a low voltage. The bucket underneath the storage node SG is well defined by the low voltages on the transfer element TX1 and output element TX2. Next to the output element TX2, a second conversion node or floating diffusion (FD2 on FIG. 6-FIG 12) is shown, where the charges are converted to a voltage. The second floating diffusion node FD2 can be reset to the pixel voltage VDDPIX by means of the reset gate RST, in the classical way as it is done in CMOS pixels.

To improve charge transfer from the sensing layer 110 to the storage layer 120, 140, a proper bias can be chosen for the two layers (e.g. semiconductor substrates, e.g. Si substrates) that is different from each other. For example, the substrate corresponding to the storage layer may be biased higher in voltage than the substrate corresponding to the sensing layer.

Figure 7:
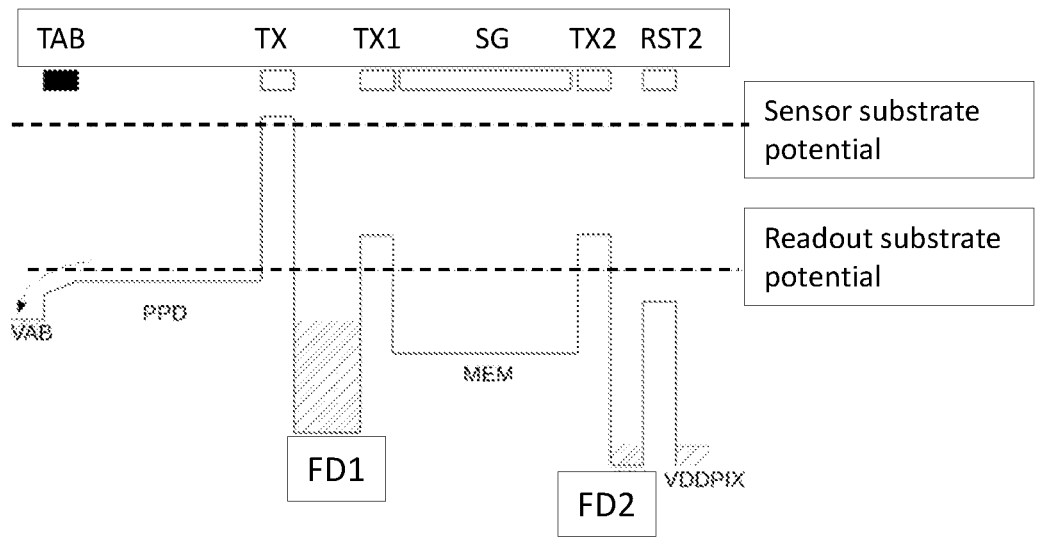

FIG. 7 shows the step of "cleaning" the sensing element PPD from charges stemming from noise, leakage current, cross-talk, etc. This can be simply being done by means of a pulse on the anti-blooming transistor $T_{AB}$. A black box indicates that the gate has been activated, changing its potential (increasing the voltage), also in the remaining figures. This can be done globally, simultaneously for all pixels of the image sensor. For example, the control unit 502 may perform this simultaneous action. The barrier provided by TAB between the PPD and the voltage source VAB is lowered so that any remaining charges such electrons in the PPD can flow into the voltage source VAB.

Figure 8:
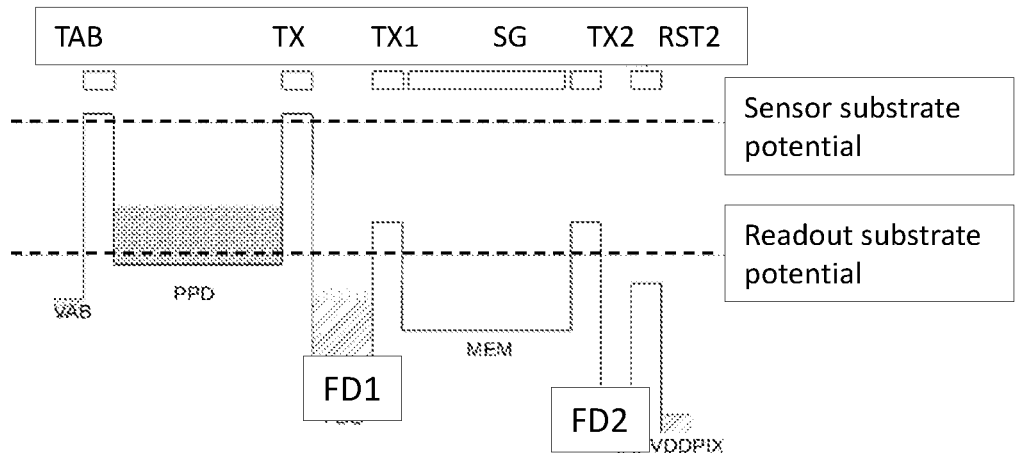

FIG. 8 shows that the barrier between the PPD and VAB is re-established, so the exposure starts and charges are collected in the PPD bucket. This is indicated by the net-like rectangle in the PPD bucket, representing the photon-generated charges. At the same time, the floating diffusion FD1 may also collect electrons from e.g. leakage current, parasitic light coming to the FD1, etc. Thus, before the photo-charges of the PPD can be transferred, the floating diffusion FD1 can be cleaned.

Figure 9:
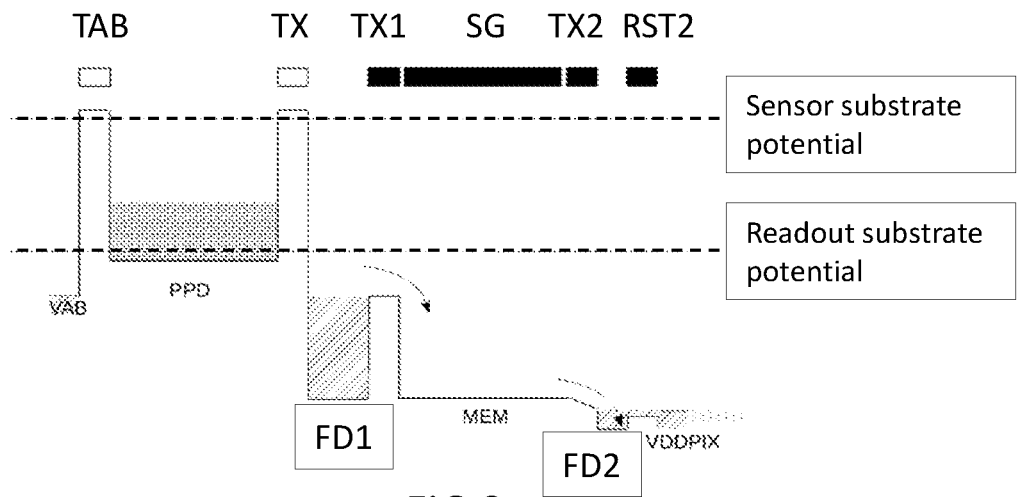

FIG. 9 shows a possibility for removing parasitic charges from the first floating diffusion region FD1. This can be done by shifting the charges out of the first floating diffusion region FD1 across the TX1, SG and TX2 into the second floating diffusion region FD2. In the meantime the reset transistor RST is active as well, and all charges from the FD1 can flow to the reset drain. This PPD can be emptied and can be done also globally, for all the pixels of the array. A further reset transistor RST1 can be used as shown in FIG. 3, for example provided on the sensing layer, to reset the floating diffusion region FD1.

After this global action, the sensor is basically ready to transfer the charges from the sensing element PPD to the storage node SG of the memory element of each pixel of the array.

Figure 10:
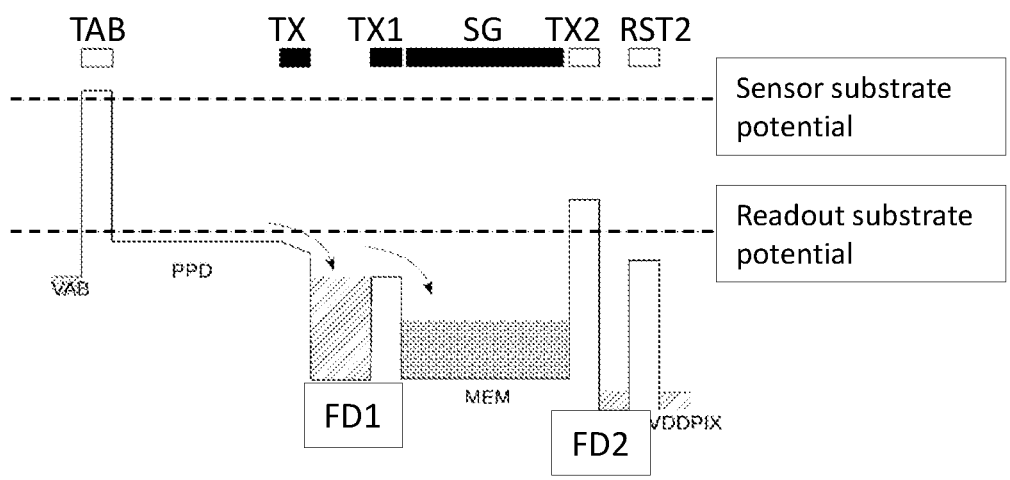

This transfer is illustrated in FIG. 10, showing how the charge is transported towards and stored in the storage node SG of the memory element 121. To initiate this transport from the sensing element PPD to the memory element MEM comprising the storage node SG, the latter is shielded from the second floating diffusion region FD2 by means of a low voltage on TX2, while the storage node SG itself and the transfer element TX1 are kept at a high voltage (by biasing the gate of the storage node SG). For example, the bias of TX1 (and of SG) does not need to be changed compared to the situation of cleaning the FD1 (FIG. 9), but the transfer element TX2 is biased at low voltage or not biased. Thus, when opening the transfer gate TX, all charges from the PPD will be transported to the FD1, but because the original voltage on FD1 is equal to the one on TX1, the charges will flow from the PPD towards the storage node SG.

The voltage bias may be higher than the voltage of the sensing element. For example, if the pinning voltage of the PPD is 1.5 V, the voltage bias of TX1 may be e.g. 2 V.

Figure 11:
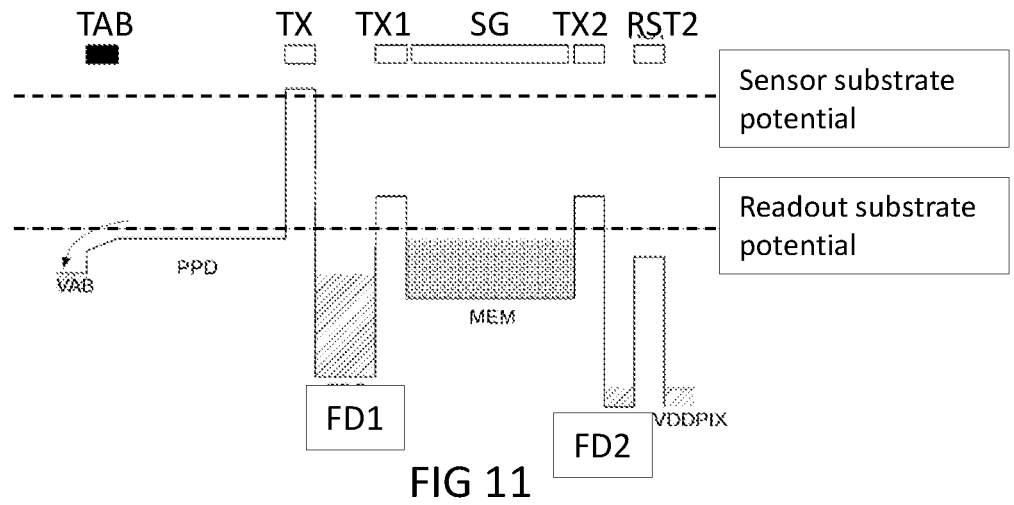

After the global transport of the charge to the MEM node, the barrier between the PPD and the FD1 is re-established, by means of a low voltage on TX. After this TX closure, two further actions can start, for example, but not required, in parallel:

An optional cleaning of the PPD (by activating TAB, as shown in FIG. 11) and a new exposure of the PPD (if needed).

Readout of the data stored in the memory node in the classical way while maintaining the option for correlated double sampling (reset FD2, measure reference level, transfer charges through TX2, e.g. by biasing TX2 to higher voltage, measure signal from photon-generated charge).

The readout of the memory nodes can be done in an analogous way as the readout of charge from photodiode in the rolling shutter mode.

The present invention can be used in automotive applications, where analysis of images of moving objects is required, e.g. fast-moving objects, in surveillance and in other video applications, e.g. at high frame rates. Machine vision is a typical example. Compared to other active pixel sensors, most of the active circuitry is provided on a layer not exposed to light, so the pixel area can be utilized efficiently. This improves fill factor and allows higher sensitivity in the pixels. Applications may therefore include low intensity radiation, e.g. low light applications. CDS may also be implemented, further reducing noise effects.

In summary, the present invention provides a pixel with a reduced size, because the storage node can be located on the second layer of the stacked device, optionally also the readout stage (e.g. source follower). Its storage node can be completely shielded from incoming light which results is an extremely low parasitic light sensitivity. The solution provided by the present invention is compatible with backside illumination, thus providing a BSI pixel, without the need for very complicated shielding technology for the storage node.

With existing techniques, the combination of near-IR incoming light with a GS sensor in the charge domain is very difficult, but when the storage node is located on the second layer of the stacked device, the light sensitive part of the device can be optimized for near-IR and/or MTF without any constrains on the parasitic light sensitivity. Potentially global shutter pixels can be realized that are smaller than today's limit for the front-side illuminated devices (2.2 µm). The concept of this idea can be easily extended to a device with several storage nodes, for instance to be used in high dynamic range applications or automotive applications to prevent light flickering issues.

The invention claimed is:

1. A pixel for a global shutter pixel array, the pixel comprising a sensing layer and a storage layer, the sensing layer comprising:
  a sensing element adapted to provide charges upon receiving radiation;
  a first floating diffusion region for receiving charges from the sensing element;
  the storage layer comprising:
  at least one storage node for receiving charges from the first floating diffusion region of the sensing layer and for storing said charges;
  the sensing layer and storage layer forming a stack of layers, the sensing layer covering at least the storage node of the storage layer and the stack further comprising a light shield at least between the sensing layer and the storage node of the storage layer so the storage node is shielded from radiation;

wherein the storage node is provided between two transfer gates, and the storage node and the two transfer gates are provided between the first floating diffusion region and a second floating diffusion region, wherein the storage node and the two transfer gates are provided on the storage layer.

2. The pixel of claim 1, wherein the sensing layer and the storage layer each comprise a connection to a different bias voltage, wherein the bias voltage of the storage layer is higher than the bias voltage of the sensing layer.

3. The pixel of claim 1, wherein the storage layer comprises a region electrically connected to the floating diffusion region of the sensing layer so that the floating diffusion region extends into the storage layer forming a common floating diffusion region.

4. The pixel of claim 3, wherein the common floating diffusion region (FD1) is formed from at least one diode in each of the sensing layer and the storage layer.

5. The pixel of claim 4, wherein the first floating diffusion region (FD1) is formed from a first diode in the sensing layer and a second diode in the storage layer, electrically connected to one another by a hybrid bonding pad.

6. The pixel of claim 3, wherein the storage layer further comprises a readout stage adapted to provide a readout signal based on the charges stored in the storage node.

7. The pixel of claim 6, wherein the readout stage comprises a source follower connected to the second floating diffusion region on the storage layer.

8. The pixel of claim 3, wherein the pixel comprises a backside illumination configuration.

9. The pixel of claim 3, wherein the storage layer comprises more than one storage node, each adapted to receive charges from the floating diffusion region of the sensing layer and to provide charges to a same readout circuit.

10. An image sensor comprising an array of the pixels of claim 3, the image sensor including circuitry configured to drive the array in global shutter mode.

* * * * *